United States Patent [19]

DiIorio et al.

[11] Patent Number: 5,367,178
[45] Date of Patent: * Nov. 22, 1994

[54] HIGH-TC MICROBRIDGE SUPERCONDUCTOR DEVICE UTILIZING STEPPED EDGE-TO-EDGE SNS JUNCTION

[75] Inventors: Mark S. DiIorio; Shozo Yoshizumi; Kai-Yueh Yang, all of San Diego, Calif.

[73] Assignee: Biomagnetic Technologies, Inc., San Diego, Calif.

[*] Notice: The portion of the term of this patent subsequent to Jul. 28, 2009 has been disclaimed.

[21] Appl. No.: 894,079

[22] Filed: Jun. 5, 1992

Related U.S. Application Data

[63] Continuation of Ser. No. 644,905, Jan. 22, 1991, Pat. No. 5,134,117.

[51] Int. Cl.⁵ .............................. H01L 39/22
[52] U.S. Cl. .................... 505/190; 257/33; 257/34; 257/35; 257/31; 505/1
[58] Field of Search ............ 257/31, 33, 34, 35; 505/1, 734, 737, 741

[56] References Cited

U.S. PATENT DOCUMENTS

| | | | |
|---|---|---|---|
| 4,264,916 | 4/1981 | Tsang | 257/35 |
| 4,299,679 | 11/1981 | Suzuki | 204.24/192.24 |
| 4,414,738 | 11/1983 | Jelks et al. | 437/177 |
| 4,454,522 | 6/1984 | deLozanne | 257/36 |
| 4,630,081 | 12/1986 | Calviello | 257/39 |
| 4,831,421 | 5/1989 | Gallagher et al. | 257/34 |
| 4,925,829 | 5/1990 | Fujita et al. | 505/1 |
| 5,001,108 | 3/1991 | Taguchi | 505/1 |
| 5,134,117 | 7/1992 | DiIorio et al. | 257/33 |

FOREIGN PATENT DOCUMENTS

| | | |
|---|---|---|
| 64-11378 | 1/1989 | Japan. |
| 1-161881 | 5/1989 | Japan. |

OTHER PUBLICATIONS

Takayuki Yanagawa et al., "Failure Analysis of Evaporated metal Interconnections at Contact Windows", *IEEE Tran. on Electron Devices*, vol. ED-17, No. 11, pp. 964–970 (Nov. 1970).

A. deLozanne et al., "Fabrication and Josephson behavior of high-Tc superconductor–normal–superconductor microbridges", *Appl. Phys. Lett.*, vol. 42, No. 6, pp. 541–543 (Mar. 1983).

R. H. Koch et al., "Quantum interference devices made from superconducting oxide thin films", *Appl. Phys. Lett.*, vol. 51(3), pp. 200–202 (1987).

T. C. Huang et al., "Structure and Superconducting Properties of TlCa(n–1)Ba2CunO(2n+3) Thin Films with Zero Resistance at Temperatures above 100K", (List continued on next page.)

*Primary Examiner*—Sara W. Crane
*Attorney, Agent, or Firm*—Gregory Garmong

[57] ABSTRACT

A microbridge superconductor device includes a substrate, made of a material such as $LaAlO_3$, having a lower planar substrate surface, an inclined surface having an overall upward inclination of from about 20 to about 80 degrees from the plane of the lower planar substrate surface, and an upper planar substrate surface parallel to the lower planar substrate surface and separated from the lower planar substrate surface by the inclined surface. A layer of a c-axis oriented superconductor material, made of a material such as $YBa_2Cu_3O_{7-x}$, is epitaxially deposited on the lower planar substrate surface, and has an exposed a-axis edge adjacent the intersection of the lower planar substrate surface with the inclined surface. The a-axis exposed edge is beveled away from the intersection. A layer of a c-axis oriented superconductor material is epitaxially deposited on the upper planar substrate surface, and has an exposed a-axis edge adjacent the inclined surface. A gap lies between the two a-axis exposed edges. A layer of a non-superconductor material, such as silver, lies in the gap between the two exposed a-axis edges, thereby defining a SNS superconductor microbridge device. The layers of superconductor material are preferably patterned to form a Josephson junction device such as a superconducting quantum interference device.

3 Claims, 3 Drawing Sheets

OTHER PUBLICATIONS

*Japanese Journal of Applied Physics*, vol. 27, pp. L1498–L1500 (1988).

D. W. Face et al., "Transport and Structural Properties of Bi–Sr–Ca–Cu–Oxide Thin Films Prepared by Reactive Magnetron Sputtering," Presented at Applied Superconductivity Conference (Aug. 1988).

Hiroshi Akoh et al., "S–N–S Josephson Junction Consisting of Y–Ba–Cu–O/Au/Nb Thin Films", *Jap. Jour. of Appl. Phys.*, vol. 27, No. 4, pp. L519–L521 (Apr. 1988).

R. W. Simon, "Low-loss substrate for epitaxial growth of high–temperature superconductor thin films", *Appl. Phys. Lett.*, vol. 53(26), pp. 2677–2679 (Dec. 1988).

R. T. Kampwirth et al., "Superconducting Properties of Magnetron Sputtered Bi–Sr–Ca–Cu–O and Tl–Ba–Ca–Cu–O Thin Films", *Science & Technology of Thin Film Superconductors*, Plenum Press, New York, pp. 165–173 (1989).

S. H. Liou et al., "Highly Oriented Tl2Ba2Ca2Cu3O10 thin films by pulsed laser evaporation", *Appl. Phys. Lett.*, vol. 54(8), pp. 760–762 (1989).

John Talvacchio, "Electrical Contact to Superconductors", *IEEE Transactions on Components, Hybrids, and Manufacturing Technology*, vol. 12, No. 1, pp. 21–31 (1989).

James D. Doss, "Engineer's Guide to High–Temperature Superconductivity", John Wiley & Sons, p. 111 (1989).

R. H. Koch et al., "Low–noise thin–film TlBaCaCuO dc SQUIDs operated at 77K", *Appl. Phys. Lett.*, vol. 54(10), pp. 951–953 (Mar. 1989).

John Moreland et al., "Evidence for the superconducting proximity effect in junctions between the surfaces of YBa2Cu3Ox films", *Appl. Phys. Lett.*, vol. 54, No. 15, pp. 1477–1479 (Apr. 1989).

V. Foglietti et al., "Noise and hysteresis in flux–locked TlBaCaCuO SQUIDs", *Appl. Phys. Lett.*, vol. 54(22), pp. 2259–2261 (May 1989).

D. W. Face et al., "Bi–Sr–Ca–Cu–Oxide Thin Films with Tc>100K and dc SQUIDs", Presented at International Conference on Materials and Mechanisms of Superconductivity (Jul. 1989).

R. W. Simon, "YBCO Microbridges", manuscript of summary paper presented at 4th NYSIS Conf. on Superconductivity and Applications, the 1990 Applied Superconductivity Conference, and the Fall 1990 SPIE Microelectronic Processing Integration Conference.

J. Gao et al., "Controlled preparation of all high–TcSNS–type edge junctions and DC SQUIDs", *Physica*, vol. C171, pp. 126–130 (1990).

R. B. Laibowitz et al., "All high Tc edge junctions and SQUIDs," *Appl. Phys. Lett.*, vol. 56(7), pp. 686–688 (Feb. 1990).

R. Gross et al., "Low Noise YBa2Cu3O(7-del) grain boundary junction dc SQUIDs", *Appl. Phys. Lett.*, vol. 57(7), pp. 727–729 (Aug. 1990).

D. K. Chin et al., "Novel all–high Tc epitaxial Josephson junction", *Appl. Phys. Lett.*, vol. 58(7), pp. 753–756 (1991).

M. S. DiIorio et al., "Practical high Tc Josephson junctions and dc SQUIDs operating above 85K", *Appl. Phys. Lett.*, vol. 58(7), pp. 2552–2554 (1991).

HIGH-TC MICROBRIDGE SUPERCONDUCTOR DEVICE UTILIZING STEPPED EDGE-TO-EDGE SNS JUNCTION

This is a continuation of application Ser. No. 07/644,905, filed Jan. 22, 1991, now U.S. Pat. No. 5,134,117.

BACKGROUND OF THE INVENTION

This invention relates to superconducting devices, and, more particularly, to a microbridge superconductor device incorporating a high-temperature superconductor material.

High-temperature superconductor materials are those having a normal-to-superconducting transition temperature, also known as $T_c$, of more than about 77 K., the boiling point of liquid nitrogen. At temperatures below its $T_c$, the superconducting material exhibits no resistance to the passage of electrical currents. The discovery of high-temperature superconductor materials has led to the possibility of many new applications of superconductors, because of the lower cooling and insulation requirements of the high-temperature superconductors as compared with conventional low-temperature superconductors.

The most important high-temperature superconductors discovered to date have been complex oxide compounds. These materials may be fabricated by depositing a thin film having the required composition of the metallic elements and either simultaneously or subsequently oxidizing the thin film to the required oxidation state. As an example, one of the most important of the high-temperature superconductor materials is $YBa_2Cu_3O_{7-x}$, where x is small, typically on the order of 0.1.

To utilize the high-temperature superconducting materials, they must be fabricated into devices and products. An initial step in this utilization is to determine whether the high-temperature superconductors can be directly substituted for conventional low-temperature superconductors. To make this determination, an existing device that utilizes the well-known low temperature is superconductors constructed, substituting the high-temperature superconductor materials for the low-temperature superconductor materials, and its operation is evaluated. For example, in one application it is desirable to construct a thin-film microbridge superconducting device having Josephson junctions therein for use in manufacturing a detector such as a superconducting quantum interference device (SQUID). A SQUID made with a high-temperature superconductor in the Josephson junctions could be operable at temperatures as high as the $T_c$ of the superconductor, which is above 77 K., and therefore could be used in numerous applications that do not require cooling to near-absolute zero.

U.S. Pat. No. 4,454,522 discloses a thin-film microbridge superconducting device in which superconducting layers ar e deposited upon a stepped substrate. A layer of normal material (that is, not superconducting at the temperature of operation of the superconducting layers) is deposited overlying the superconducting layers. The gap between the superconducting layers along the step creates a microbridge that is the basis for a Josephson junction. The superconducting layers can be further patterned to produce a loop and leads, thereby creating a SQUID.

Unfortunately, the approach of the '582 patent is intrinsically not suited for producing an operable SQUID utilizing the anisotropic high-temperature superconducting materials such as those of the complex-oxide type. There nevertheless remains a need for a thin-film microbridge and a fabrication technique for its production. The present invention fulfills this need, and further provides related advantages.

SUMMARY OF THE INVENTION

The present invention resides in a thin-film microbridge superconductor device using high-temperature superconductors, producing a thin-film Josephson junction which can be used in a SQUID or other device operable in the temperature range from 4.2 K. (and possibly even lower) to the critical temperature of the superconductor, above 77 K. The method used to produce the microbridges is reliable, and has been practiced using existing thin-film fabrication techniques.

In accordance with the invention, a microbridge superconductor device comprises a substrate having a lower planar substrate surface, an inclined surface having an overall upward inclination of from about 20 to about 80 degrees from the plane of the lower planar substrate surface, and an upper planar substrate surface parallel to the lower planar substrate surface and separated from the lower planar substrate surface by the inclined surface. A layer of a c-axis oriented superconductor material is deposited upon the lower planar substrate surface, in epitaxial relation thereto. The superconductor layer on the lower planar substrate surface has an exposed a-axis edge adjacent to the intersection of the lower planar substrate surface with the inclined surface. The exposed a-axis edge is beveled away from the intersection of the lower planar substrate surface and the inclined surface. A layer of the c-axis superconductor material is deposited on the upper planar substrate surface, in epitaxial relation thereto. This layer has an exposed a-axis edge adjacent the upper end of the inclined surface, or adjacent the inclined surface itself. There is a non-superconducting gap between the a-axis exposed edge of the c-axis oriented superconductor material of the lower planar substrate surface, and the a-axis exposed edge of the c-axis oriented superconductor material of the upper planar substrate surface. A layer of a non-superconductor material, such as a normal metal, fills the gap between the exposed a-axis edges of the two layers of c-axis oriented superconductor material, forming the weak superconducting link needed to produce the Josephson device.

Many of the high-temperature (high-$T_c$) superconductor materials are highly anisotropic in their crystallographic structure. The high-temperature superconductors are complex compounds that crystallize into well-defined structures, but the structures are not the isotropic crystallographic structures found in most low-temperature superconductor materials. Instead, many of the high-$T_c$ compounds crystallize as regularly repeating stacks of copper-oxygen planes of a characteristic structure, with various atomic arrangements between the planes. The direction perpendicular to the copper-oxygen plane is termed the "c-axis". High-temperature superconductor materials having such an anisotropic structure are termed herein "c-axis superconductor materials". Any direction perpendicular to the c-axis (i.e., parallel to the copper-oxygen planes) is termed an "a-axis".

In such an anisotropic superconductor, the superconductivity coherence length is greater in the a-axis directions 12–15 Angstroms) than in the c-axis direction (e.g., 2-3 Angstroms). An important consequence of this anisotropy is that a thin degraded layer intrinsically present, or present due to the effects of processing, on the exposed upper surface of a c-axis oriented layer (the surface perpendicular to the c-axis direction) prevents superconductivity from penetrating due to the very short c-axis coherence length. The short coherence length may prevent the inducing of superconductivity in an adjacent normal metal layer, which itself has a relatively long coherence length. Such coupling is more easily achieved through the exposed a-axis edge of the superconducting layer, where the a-axis direction is exposed and the longer a-axis coherence length reduces the likelihood of problems due to a thin degraded layer. The coupling is achieved by the proximity effect, wherein superconductivity can be induced for a distance of up to a few hundred Angstroms or more in a normal metal layer adjacent a superconducting material. The anisotropy in the coherence length of the high-$T_c$ superconductors, in particular the extraordinarily short c-axis coherence length, is believed to be a primary cause of the inability to produce high-$T_c$ superconductor devices incorporating high-$T_c$ c-axis oriented superconductor materials using the approach of U.S. Pat. No. 4,454,522.

In the approach of the present invention, the high-temperature superconductor material is deposited as a layer on a substrate having an inclined surface. The substrate is chosen to be a material to which the c-axis orientation of the high-temperature superconductor has an epitaxial (matched crystallographic) relationship. That is, the c-axis orientation of the high-temperature superconductor is perpendicular to the plane of the substrate surface. For the commercially important high-$T_c$ superconductor material $YBa_2Cu_3O_{7-x}$, a preferred substrate material which produces a c-axis oriented epitaxial layer is $LaAlO_3$.

The inclined surface of the present approach has a different geometry than that described in the '522 patent. The substrate of the present approach has the lower planar surface, the inclined surface that is inclined at an overall angle of from about 20 to about 80 degrees upwardly from the plane of the lower planar surface, and the upper planar surface at the top of the inclined surface. By contrast, the $\propto$ 522 patent describes its step as being "generally perpendicular". That approach is not operable when a c-axis oriented superconductor material is epitaxially deposited upon the substrate planar surfaces as the superconductor material, because the necessary exposed a-axis edge cannot be readily produced and accessed.

The layer of high-temperature superconductor material deposited on the lower substrate surface is beveled back from the bas e of the inclined surface, producing a good electrically conductive contact between the exposed a-axis edge of the lower superconductor layer and the normal material in the gap, so that superconductivity can be induced into the normal material of the gap. This beveled structure is also required because the superconduction path is from the exposed a-axis edge of the superconducting layer into the normal material. Thus, in the present approach the superconducting junction is from a-axis edge of one of the superconducting layers, through the normal material, and to the a-axis edge of the other superconductor layer. Significantly, only a single deposition of superconductor material is required to produce both the upper and lower superconducting layers. As a result, the interface between the superconducting material and the normal material at each of the exposed a-axis edges need not be processed, as by etching, during fabrication, reducing the chance that there could be damage to the interfacial regions, which in turn could interfere with the fabrication of an operable junction.

By contrast, in the '522 patent the edge of the superconductor material on the lower step is illustrated as generally perpendicular and square. Consequently, the superconducting conduction path must be from the top surface of the superconducting layer on the lower planar substrate surface, through the normal material, and to the top surface of the superconducting layer on the upper planar substrate surface. A good c-axis oriented superconductor-to-normal metal electrically conductive weak link cannot be formed under these conditions, because of the short superconducting coherence length in the c-axis direction.

The present invention provides a microbridge device operable in the superconducting state over the temperature range from 4.2 K. (and possibly even lower) to the $T_c$ for the c-axis material, typically well above 77 K., and a technique for its fabrication. Other features and advantages of the invention will be apparent from the following more detailed description of the preferred embodiments, taken in conjunction with the accompanying drawings, which illustrate, by way of example, the principles of the invention.

DETAILED DESCRIPTION OF THE PREFERRED EMBODIMENTS

In accordance with a preferred embodiment of the invention, a microbridge superconductor device comprises a substrate having an inclined surface thereon, the inclined surface dividing the substrate into a lower planar substrate surface and an upper planar substrate surface. A lower layer of a c-axis oriented superconductor material is epitaxially deposited on the lower planar substrate surface so that the c-axis of the superconductor material is perpendicular to the lower planar substrate surface, and this lower superconductor layer has a beveled exposed a-axis edge adjacent to the inclined surface. Simultaneously, an upper layer of a c-axis oriented superconductor material is epitaxially deposited on the upper planar substrate surface so that the c-axis of the superconductor material is perpendicular to the upper planar substrate surface, and the upper layer has an exposed a-axis edge adjacent the inclined surface. A layer of normal material lies between, and provides electrically conductive contact between, the exposed a-axis edge of the lower superconductor layer and the exposed a-axis edge of the upper superconductor layer.

Figure 1:
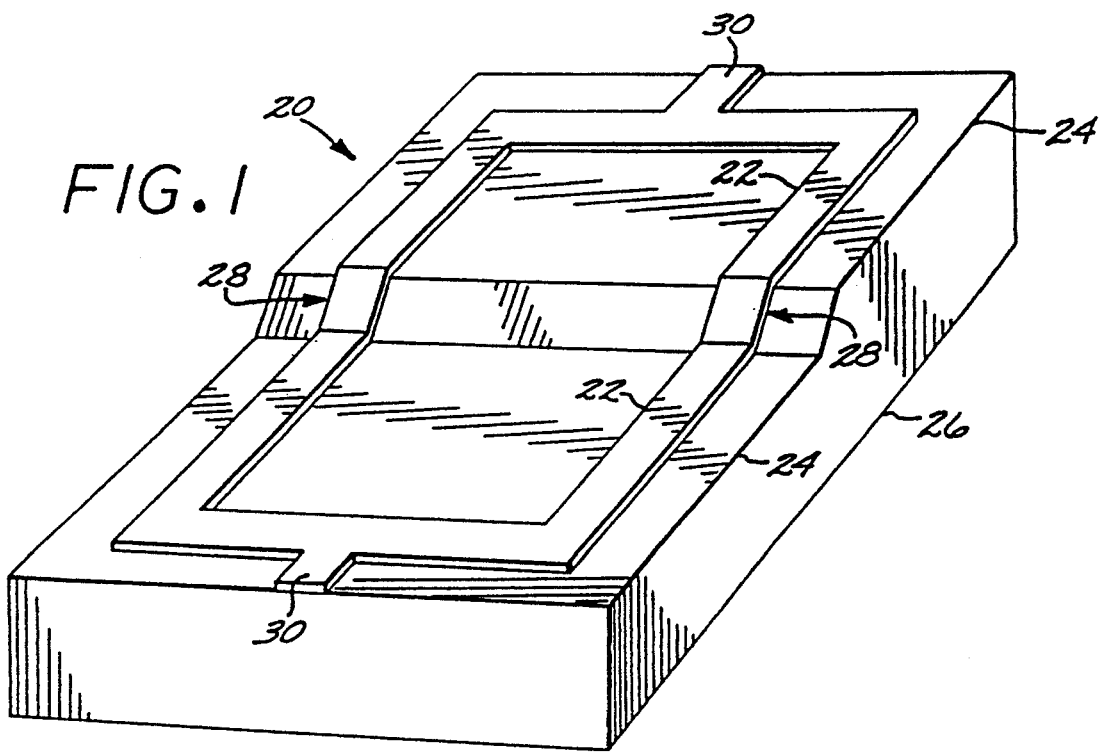
FIG. 1 is a perspective view of a SQUID device having a microbridge therein.

Referring to FIG. 1, a thin-film Superconducting QUantum Interference Device (SQUID) 20 includes a patterned loop of superconductor material 22 arranged on the two substrate surfaces 24 of a substrate 26. Microbridge junctions 28 (Josephson junctions) are located between the portions of the loop 22 on the upper and lower substrate surfaces 24. Leads 30 extend from the portions of the loop 22 on the upper and lower substrate surfaces 24. There may be either two junctions 28 in the loop 22, forming a dc SQUID, or one junction 28 in the loop 22, forming an rf (radio frequency) SQUID. The general structure and functioning of SQUIDs is well known. See, for example, "Advances in SQUID Magnetometers" by John Clarke, IEEE Trans. Electron Devices, Vol. ED-27, page 1896 (1980) and "DC SQUIDs 1980: The State of the Art", by M. B. Ketchen, IEEE Trans. Magnetics, Vol. MAG-17, page 307 (1981).

Figure 2:
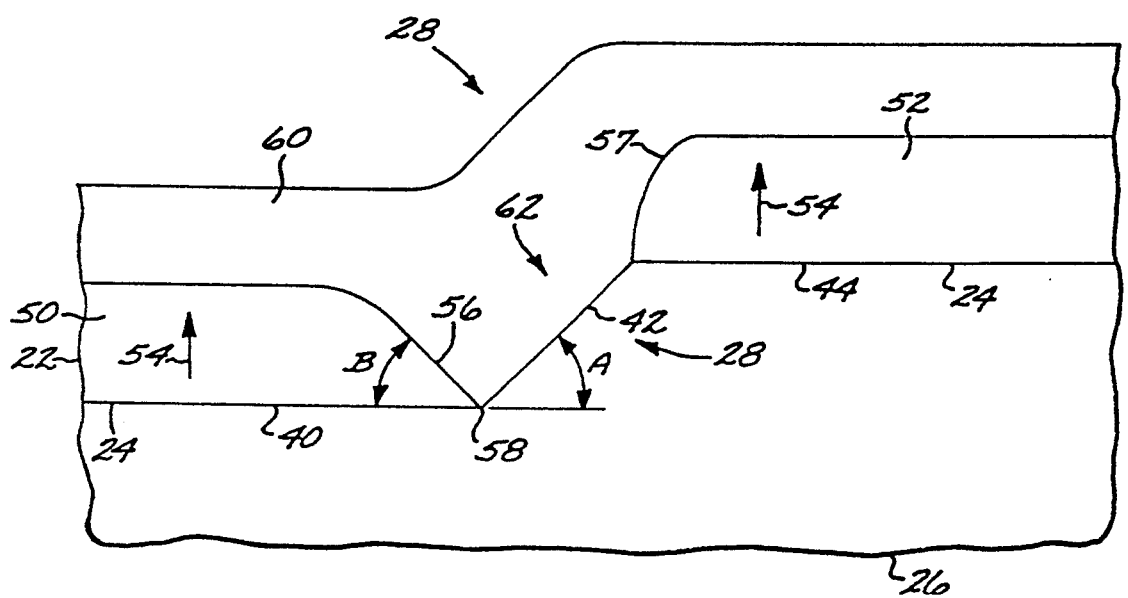
FIG. 2 is an enlarged side elevational view of a portion of the device of FIG. 1, illustrating the structure of the microbridge.

FIG. 2 illustrates the structure of one of the junctions 28 and a portion of the loop 22 in greater detail. The substrate 26 has the two substrate surfaces 24, which may be described more precisely as two planar surfaces separated by an inclined surface. A lower planar substrate surface 40 (which forms one of the substrate surfaces 24) is located at a "lower" height of the substrate 26, when the substrate is placed in an upwardly facing orientation as shown in FIG. 2. An inclined surface 42 is angled upwardly at an angle A of from about 20 to about 80 degrees from the plane of the lower planar substrate surface 40. At the top of the inclined surface 42, an upper planar substrate surface 44 is parallel to the lower planar substrate surface 40. The two planar substrate surfaces 40 and 44 are thus separated by the inclined surface 42. (This inclined surface 42 is to be contrasted with the generally perpendicular step, called the step 16, of U.S. Pat. No. 4,454,522, whose disclosure is incorporated by reference.)

A layer of superconductor material 50 is deposited upon the lower planar substrate surface 40, and a layer of superconductor material 52 is deposited upon the upper planar substrate surface 44. After patterning into a loop, the layers 50 and 52 become part of the loop 22 of FIG. 1. The layers 50 and 52 are typically deposited simultaneously and of the same high-$T_c$ material, but are most conveniently discussed as two separate elements. Each layer is deposited with a c-axis 54 of the superconductor material perpendicular to the plane of the surfaces 40 and 44, by inducing epitaxial c-axis growth on the substrate 26 in a manner to be discussed subsequently.

The layer 50 has an a-axis exposed edge 56 at its end adjacent an intersection 58 of the lower planar substrate surface 40 with the inclined surface 42. The a-axis exposed edge 56 is beveled or angled backwardly away from the inclined surface 42. The angle B of the bevel is less than 90 degrees, and is preferably less than about 70 degrees. The upper layer 52 has a corresponding a-axis exposed edge 57 at the end of the layer adjacent the inclined surface 42. Although the edge 57 is normally slightly beveled away from the inclined surface 42 as shown, it need not be. A normal layer 60 of a non-superconducting material is deposited overlying the layers 50 and 52, and the exposed portion of the substrate 26. A gap 62 between the respective a-axis exposed edges 56 and 57 of the layers 50 and 52, through the intervening portion of the normal layer 60, defines the superconductor to normal material to superconductor (SNS) microbridge junction 28.

The a-axis exposed edges 56 and 57 are so named because they constitute conducting surfaces, through which a current may flow, between the normal material of the layer 60 and the superconducting material of the layers 50 and 52. The a-axis exposed edges 56 and 57 expose a component of the a-axis face of the c-axis oriented high-$T_c$ superconductor material. The microbridge junction devices 28 are fabricated in a manner, to be described, that ensures a good contact between the beveled a-axis exposed edges 56 and 57, and the normal material layer 60 in the gap 62. The current flow path of the junction 28 is therefore from one edge 56 or 57, through the normal material 60 (which is made locally superconducting according to the proximity effect), and through the other edge 57 or 56, respectively.

The high-$T_c$ material of the layers 50 and 52 is preferably a complex superconducting oxide or other anisotropic material of the type that exhibits superconductivity below some critical temperature. These materials are typically c-axis materials having a stacked-planar crystallographic structure with a c-axis perpendicular to the planes and a-axes lying in the planes, as discussed previously. This structure is described, for example, in M. B. Beno et al., Appl. Phys. Lett., vol. 51, page 57 (1987) and A. Williams et al., Phys. Rev., vol. B37, page 7960 (1988). A preferred material for the layers 50 and 52 is the high-$T_c$ superconductor $YBa_2Cu_3O_{7-x}$, where x is determined by the degree of oxidation but is typically about 0.1. This material has a $T_c$ of about 90 K. when deposited as a thin film. It may be epitaxially deposited so that the c-axis is perpendicular to a substrate surface by known techniques, which include selection of a substrate 26 having lattice parameters that match within a few percent that of the crystallographic face perpendicular to the c-axis. A known material for achieving such c-axis epitaxial growth is lanthanum aluminate, $LaAlO_3$, provided so that the planar surfaces 40 and 44 are of the (100) crystallographic orientation. The selection of $LaAlO_3$ is preferred, and not limiting of the invention. Other substrate materials include $SrTiO_3$, $MgO$, yttria-stabilized zirconia, $Al_2O_3$, $LaGaO_3$, $PrGaO_3$, and $NdGaO_3$. For other high-$T_c$ materials, $LaAlO_3$ or other substrate materials which produce epitaxial growth are selected. Examples of other suitable high-$T_c$ materials include $Bi_2Ca_2Sr_2Cu_3O_x$ and $Tl_2Ba_2Ca_2Cu_3O_x$.

The microbridge junctions 28 and SQUID 20 are preferably fabricated by the following approach, which is illustrated pictorially in FIG. 3. A single crystal piece of $LaAlO_3$ is provided as the substrate 26 with its surface having a (100) crystallographic orientation, FIG. 3A. That surface is first etched to form the planar surfaces 40 and 44, with the inclined surface 42 between them. The etching procedure includes depositing a metal film 70 that will act as a mask onto the surface of the substrate 26, FIG. 3B. The metal film is preferably either niobium in a thickness of about 3000 to about 3500 Angstroms (A), or molybdenum in a thickness of from about 2500 Angstroms to about 4000 Angstroms, deposited by sputtering. The metal film 70 is patterned with a step by depositing a standard photoresist material onto the film, exposing a pattern into the photoresist, and removing the exposed portion of the photoresist. The step 72 is formed in the metal layer 70 by ion milling through the patterned photoresist material. Typical ion milling parameters are an ion beam energy of 400 electron volts, and a beam current density of 0.45 to 0.90 milliamps per square centimeter, resulting in an etching rate of 200–400 Angstroms per minute. The photoresist is then stripped by placing the patterned substrate into a solvent for the photoresist, leaving the structure shown in FIG. 3C.

Figure 3A:
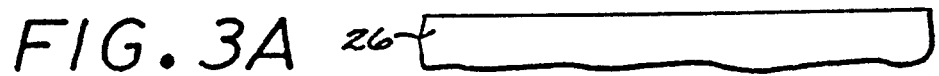
FIGS. 3A to 3G are a pictographic flow chart of the fabrication of a microbridge device, illustrating the structure at various points of the fabrication procedure.
Figure 3B:
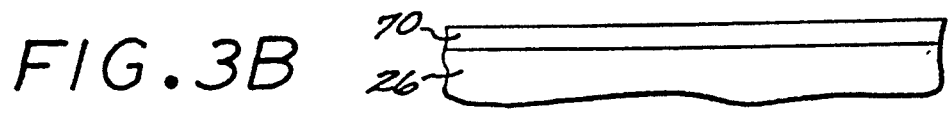
Figure 3C:
Figure 3D:
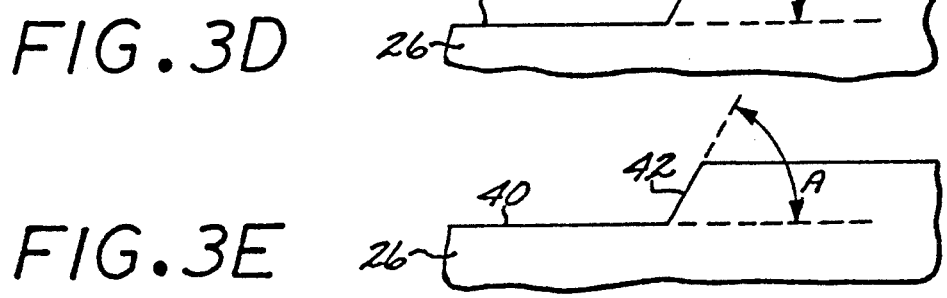
Figure 3E:
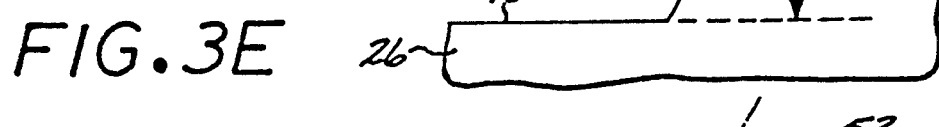
Figure 3F:
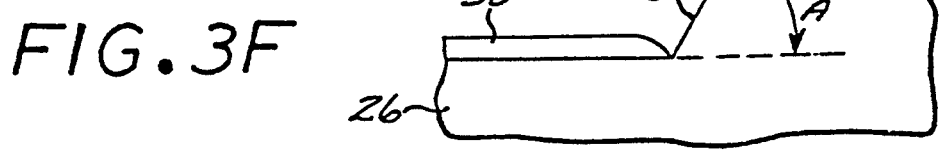

The step pattern in the metal mask is used to form the inclined surface 42 on the substrate by ion milling the masked substrate. The ion milling procedure produces the inclined surface 42, which lies at an angle A from the substrate 26, as shown in FIG. 3D, while still retaining the lower planar substrate surface in the (100) crystallographic orientation. Typical ion milling parameters are a beam energy of 400–500 electron volts and a beam current density of 0.2 to 1.8 milliamps per square centimeter. The resulting etching rate is typically about 400 Angstroms per minute. The perpendicular distance between the planar surfaces 40 and 44, is preferably from about 200 to about 2000 Angstroms. After the inclined surface has been ion milled into the substrate surface, the metal layer 70 is removed, FIG. 3E, by plasma etching in the case of niobium or etching in a wet etch acid solution of nitric acid, sulfuric acid, and water in the case of molybdenum.

The layers of superconducting material 50 and 52 are next deposited simultaneously onto the surface of the substrate 26. The layers 50 and 52 are preferably deposited by off-axis sputter deposition of $YBa_2Cu_3O_{7-x}$, see FIG. 3F. The thickness of the layers 50 and 52 is preferably from about 100 to about 2900 Angstroms. Typical sputter deposition parameters are a partial pressure of argon of 165 millitorr, a partial pressure of oxygen of 35 millitorr, a substrate temperature of 710° C., and a dc power of 90 watts. The transition temperature, $T_c$, of the resulting superconducting film is about 88 K.

Figure 3G:
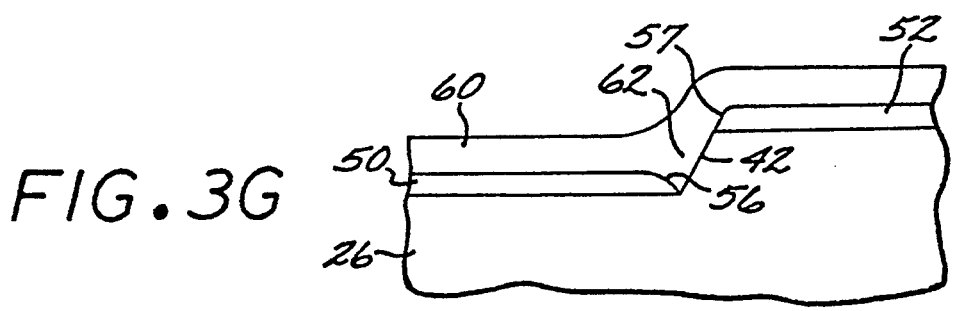

The normal layer 60 is deposited by sputtering immediately after the layers 50 and 52 are deposited, without removing the sample from the deposition chamber, as shown in FIG. 3G and FIG. 2. The normal layer may be a metal, a semi-metal, or a semiconductor. The preferred material for the layer 60 is silver, but could be another metal such as gold or a low carrier density material such as 5% Nb-doped $SrTiO_3$. The superconductor and normal metal sources are located behind shutters in the chamber, and the silver source is started prior to completion of the operation of the superconductor material source. The substrate is heated to 710° C. for superconductor deposition, but the heater setting is changed to reduce the substrate temperature to about 550° C. for the silver deposition. The oxygen flow is stopped, and the chamber is evacuated to 125 millitorr. The substrate support and heater are then rotated so that the silver deposits over the inclined surface and joins the two superconducting film edges 56 and 57 through the gap 62 region. It is critical to achieve a good conducting path at the beveled a-axis exposed edge 56, and along the edge 57 of the layer 52. The preferred thickness of the silver layer is from about 100 Angstroms to about 2000 Angstroms.

After the silver layer is deposited and the silver deposition discontinued, the oxygen gas valve is reopened, and an oxygen pressure of about 750 Torr introduced into the chamber. The silver-coated substrate is soaked in oxygen at a temperature of about 430° C. for 30 minutes. The oxygen treatment causes oxygen to diffuse through the silver normal layer 60 to the superconductor layers 50 and 52, reoxidizing the upper surfaces of the layers 50 and 52. This reoxidation is believed desirable, because during low-pressure deposition of the silver some of the oxygen at the upper surface of the layers 50 and 52 can diffuse out of the surface and be pumped away, leaving the upper surface of the layers 50 and 52 oxygen deficient. The $T_c$ value of the oxide superconductor falls with increasing values of x in the composition $YBa_2Cu_3O_{7-x}$, and therefore vacuum depletion of the upper surface of the layers 50 and 52 can cause these upper surfaces to become non superconducting, an undesirable result. Reoxidation of the upper surface, through the thin silver layer, ensures that a high value of $T_c$ will be achieved.

After the junctions 28 are completed in the manner just described, the loop conductor patterns 22 shown in FIG. 1 are formed by standard photoresist techniques. A layer of photoresist is deposited onto the upper surface of the layer 60, a loop pattern is photolithographically patterned into the photoresist layer, and the exposed portions are removed by ion milling to leave the pattern of loop 22 and leads 30, as well as the microbridge junctions 28. Typical ion milling conditions are a beam energy of 250 electron volts and a beam current density of 0.2 milliamps per square centimeter. The remaining photoresist pattern is then removed in an appropriate solvent, and the SQUID 20 is complete.

Figure 4:
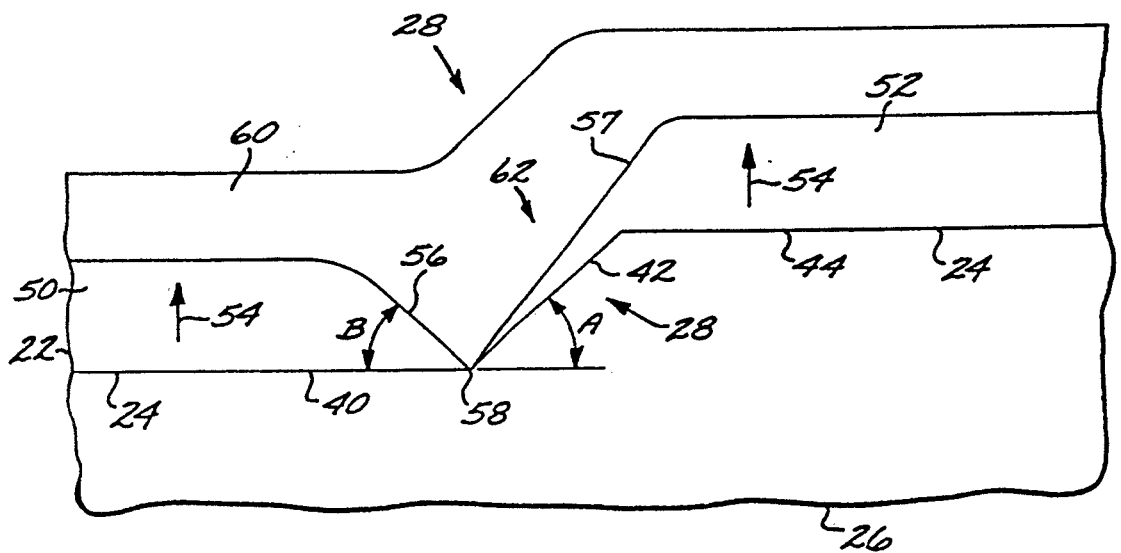
FIG. 4 is an enlarged side elevational view similar to that of FIG. 2, illustrating another structure of the microbridge.
Figure 5:
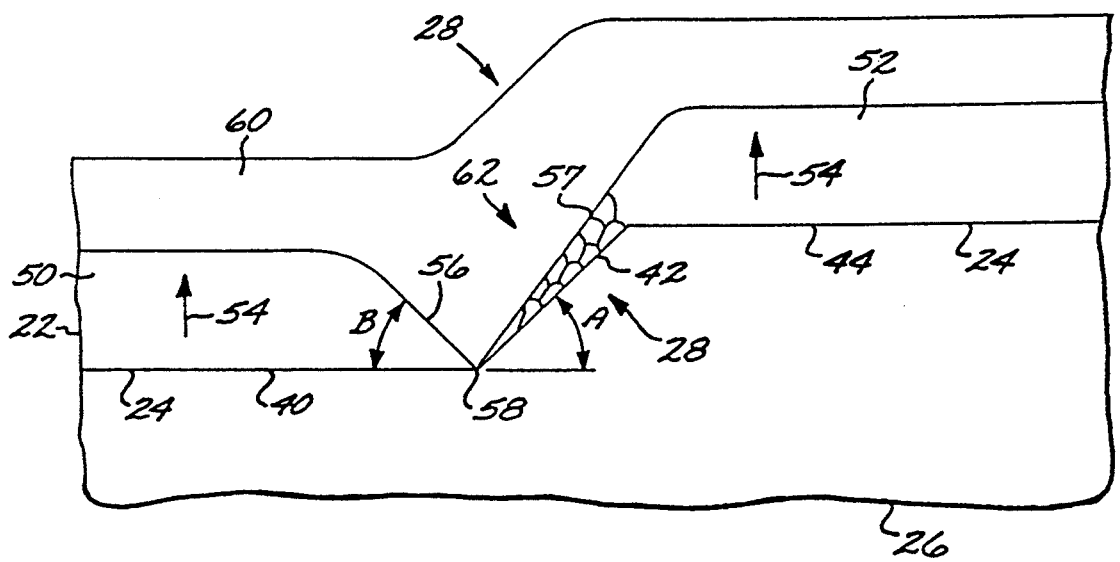
FIG. 5 is an enlarged side elevational view similar to that of FIG. 2, illustrating yet another structure of the microbridge.

This fabrication procedure is preferred, and does not exclude other operable fabrication procedures and their resulting junction structures. Two other structures of the junction region within the scope of the invention are shown in FIGS. 4 and 5, in which elements corresponding to those of FIG. 2 are identically numbered. In FIGS. 4 and 5, the upper layer 52 extends down the inclined surface 42, as a result of the mode of deposition in the fabrication processing. In the structures of FIGS. 4 and 5, the edge 57 is adjacent all or most of the inclined surface 42, while in the structure of FIG. 2, the edge 57 is adjacent only the upper end of the inclined surface 42.

In the junction structure of FIG. 4, the material in that portion of the upper layer 52 adjacent the inclined surface 42 is oriented in the same manner along the entire length of the edge 57. In the junction structure of FIG. 5, the material in the portion of the upper layer 52 adjacent the inclined surface 42 is polycrystalline with grains oriented in a range of angles with at least some a-axis oriented material exposed at the edge 57. In both cases, as with the structure depicted in FIG. 2, an operable junction is formed with conduction between the a-axis material exposed at edges 56 and 57 through the gap 62 filled with normal material. In the structure of FIG. 4, the superconducting path can extend to any part of the edge 57. In the structure of FIG. 5, the exposed edge 57 will include some crystals with an exposed a-axis and others with an exposed c-axis, and the superconducting path will be through the exposed a-axis crystals.

The following example illustrates aspects of the invention, and should not be interpreted as limiting of the invention in any respect.

EXAMPLE 1

A total of 21 microbridges and SQUIDs were produced using the described fabrication approach. All 21 devices exhibit a well-defined supercurrent at temperatures from 4.2 K. to over 80 K. The device yield was therefore 100%. The devices were fabricated on three different wafers in two separate deposition runs. The distance between the surfaces 40 and 44 was about 2000–2500 Angstroms, and the thickness of the $YBa_2Cu_3O_{7-x}$ films ($T_c$ of 87 K) was about 1000 Angstroms.

The silver film thickness ranged from 3000–6000 Angstroms.

The hallmark of a true SNS junction is the demonstration of the ac Josephson effect. In response to microwave radiation, the microbridges fabricated as described exhibit the ac Josephson effect as precisely defined steps in the current-voltage characteristic. The effect is observed from 4.2 K. to above 77 K., demonstrating the high-$T_c$ nature of the device.

Dc SQUIDs were measured and exhibit a periodic modulation of the critical current in an applied magnetic field, as expected. This modulation is observed from 4.2 K. to over 85.4 K. clearly demonstrating an operable high-$T_c$ SQUID.

Thus, the present invention provides an important advance in the art of superconducting microbridge devices utilizing high-temperature superconductors. Although particular embodiments of the invention have been described in detail for purposes of illustration, various modifications may be made without departing from the spirit and scope of the invention. Accordingly, the invention is not to be limited except as by the appended claims.

What is claimed is:

1. A microbridge superconductor device, comprising:
   a substrate having an inclined surface thereon, the inclined surface dividing the substrate surface into a lower planar substrate surface and an upper planar substrate surface; and
   a junction on the surface of the substrate at the inclined surface, the junction comprising
      a superconductor layer of a c-axis type superconductor material epitaxially deposited overlying the lower planar substrate surface with the c-axis perpendicular to the plane of the lower substrate surface and deposited over the upper planar substrate surface with the c-axis perpendicular to the plane of the upper substrate surface, there being a break in the superconductor layer at the inclined surface, and
      a layer of normal material deposited overlying the inclined surface and contacting both the upper and the lower superconductor layers.

2. A microbridge superconductor device, comprising:
   a substrate having an inclined surface thereon, the inclined surface dividing the substrate surface into a lower planar substrate surface and an upper planar substrate surface; and
   a junction formed at the inclined surface, the junction comprising
      a superconductor layer of a c-axis type superconductor material deposited overlying the lower planar substrate surface and the upper planar substrate surface, there being a gap adjacent the inclined surface between the superconductor layer on the lower substrate surface and the superconductor layer on the upper substrate surface such that an a-axis direction of the c-axis type superconductor faces the gap, and
      a layer of normal material deposited overlying the inclined surface in the gap between the superconductor layer on the upper substrate surface and the superconductor layer on the lower substrate surface.

3. A microbridge superconductor device, comprising:
   a substrate having an inclined surface thereon, the inclined surface dividing the substrate surface into a lower planar substrate surface and an upper planar substrate surface; and
   a junction formed at the inclined surface, the junction comprising
      a first superconductor layer of a c-axis type superconductor material deposited overlying the lower planar substrate surface and having a first superconductor layer exposed a-axis region,
      a second superconductor layer of a c-axis type superconductor material deposited overlying the upper planar substrate surface and having a second superconductor layer exposed a-axis region, and
      a gap filled with normal material adjacent the inclined surface between the first superconductor layer exposed a-axis region and the exposed second superconductor layer a-axis region, the distance between the first superconductor layer a-axis region and the second superconductor layer exposed a-axis region being sufficiently small so that a superconducting region is induced through the normal material of the gap between the first superconductor layer exposed a-axis region and the second superconductor layer exposed a-axis region.

* * * * *